United States Patent [19]
Edelberg et al.

[11] 4,037,205
[45] July 19, 1977

[54] DIGITAL MEMORY WITH DATA MANIPULATION CAPABILITIES

[75] Inventors: Murray Edelberg, Carlisle; Lloyd R. Schissler, Jamaica Plain, both of Mass.

[73] Assignee: Sperry Rand Corporation, New York, N.Y.

[21] Appl. No.: 578,685

[22] Filed: May 19, 1975

[51] Int. Cl.² ............................................. G06F 1/00
[52] U.S. Cl. .................................................. 364/900
[58] Field of Search .................... 340/172.5; 179/15 R

[56] References Cited
U.S. PATENT DOCUMENTS

| 3,238,506 | 3/1966 | Jung et al. | 340/172.5 |
|---|---|---|---|
| 3,638,195 | 1/1972 | Brender et al. | 340/172.5 |
| 3,735,362 | 5/1973 | Ashany et al. | 340/172.5 |
| 3,748,647 | 7/1973 | Ashany et al. | 340/172.5 |

*Primary Examiner*—Malcolm A. Morrison
*Assistant Examiner*—Errol A. Krass

*Attorney, Agent, or Firm*—Howard P. Terry; Albert B. Cooper

[57] ABSTRACT

A digital memory comprising a plurality of contiguous circulating serial data storage loops and a plurality of processing elements. Each pair of adjacent loops are coupled to a processing element such that each loop is coupled through two processing elements displaced by one-half loop length. Each processing element includes a serial comparator and a loop control circuit for either isolating or exchanging the data on the two incident loops. Additional circuits are included in each processing element which in combination with the comparator and loop control provide the memory, as the loop data circulates through the processing elements, with the capability of performing an ascending or descending sort of its contents, an associative search of its contents with retrieval of located data, an updating of stored data records, a loading or unloading of a record file or data base and a dynamic reconfiguration of the memory structure.

23 Claims, 11 Drawing Figures

DIGITAL MEMORY WITH DATA MANIPULATION CAPABILITIES

BACKGROUND OF THE INVENTION

1. Field of the Invention

The present invention pertains to the field of digital computer memories and particularly to dynamic memories in which there is a continuous circulation of data.

2. Description of the Prior Art

Prior art digital computer memories normally exclusively perform the rudimentary function of data storage. Such memories may comprise magnetic or solid state storage elements or may be of the mass data file storage variety utilizing moving magnetic media. Data manipulation and management functions such as sorting, searching, retrieval and data updating are normally performed by the central processing unit (CPU) resulting in a time consuming and often inefficient utilization of the CPU.

Additionally, external networks are sometimes used in combination with basic memories to perform off line data manipulation and management functions such as sorting. This approach requires additional expensive and space consuming equipment.

SUMMARY OF THE INVENTION

The invention provides a digital computer memory which, in addition to the basic data storage function, internally performs a variety of data manipulation and management functions such as sorting, searching, data retrieval, data updating, file loading and unloading and, in addition, provides the capability of dynamic memory reconfiguration. Performance utilizing the "intelligent" memory of the present invention is generally superior with regard to corresponding operations performed by a single CPU utilizing a random access memory. An additional performance benefit is that the system CPU is then available to perform other processing tasks concurrently with the operation of the intelligent memory of the present invention.

To achieve these improvements the invention comprises a dynamic digital memory including a plurality of circulating serial data storage loops and a plurality of data processing circuit elements, each data processing element being serially coupled in each of two of the circulating storage loops with each circulating storage loop being serially coupled through two of the data processing elements at different points of the loop. The processing elements are constructed and arranged to perform the data manipulation and management operations in response to data manipulation control signals as the digital data in the loops serially circulate through the processing elements.

DESCRIPTION OF THE PREFERRED EMBODIMENT

Figure 1:
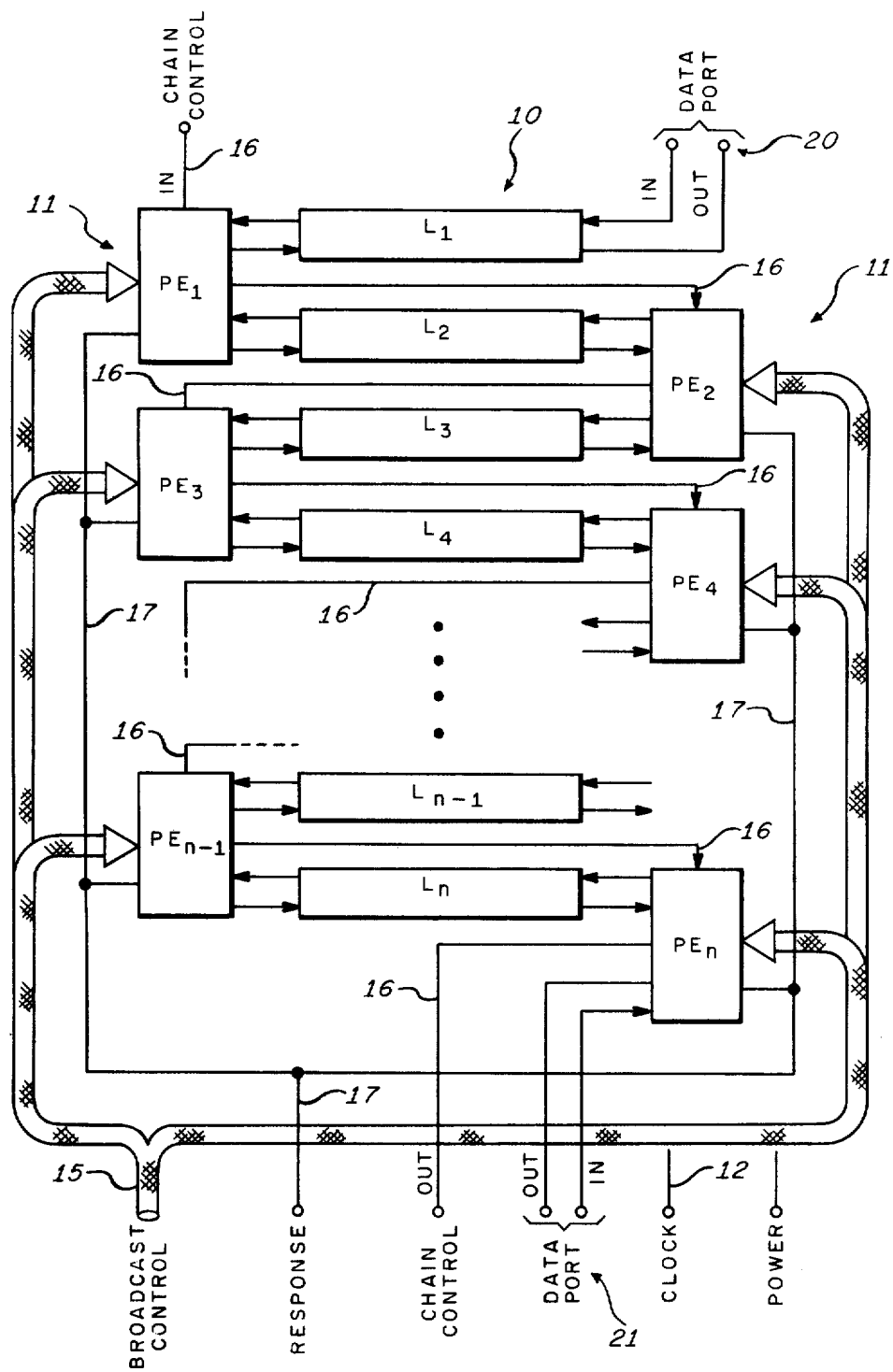
FIG. 1 is a schematic block diagram of one memory module of the present invention.
Figure 2:
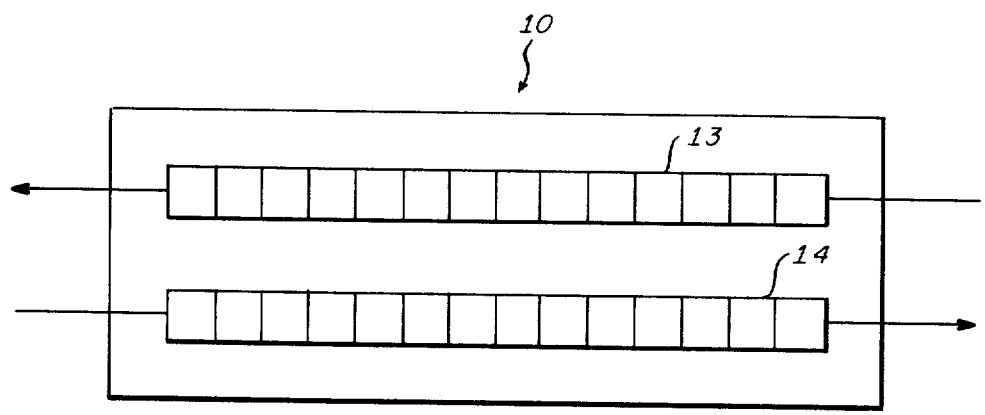
FIG. 2 is a schematic block diagram of one of the circulating serial storage loops of FIG. 1.
Figure 3:
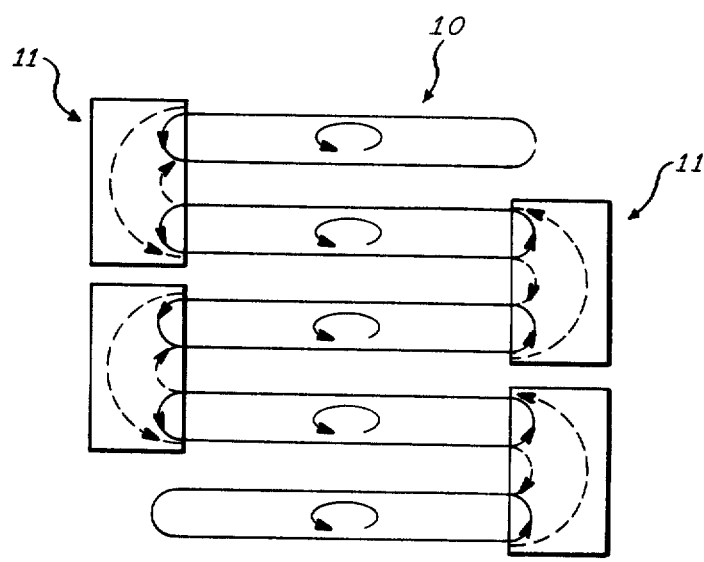
FIG. 3 is a schematic block diagram illustrating the loop connection states of FIG. 1.

Referring to FIGS. 1, 2 and 3, FIG. 1 illustrates one module of a memory of the present invention where a memory system may comprise one or more such identical modules. The memory module of FIG. 1 includes circulating serial storage loops 10 designated as $L_1$, $L_2$, ..., $L_n$ and processing elements 11 designated as $PE_1$, $PE_2$, ..., $PE_n$ where n is an even number greater than or equal to 2. Each of the storage loops 10 is a circulating shift register with all the loops being shifted synchronously from a common clock source applied at a terminal 12. It will be appreciated that the storage loops 10 may be implemented as solid state shift registers or moving medium magnetic devices such as multiple heads per track disks or drums or the like. FIG. 2 illustrates a typical loop 10 which comprises two shift registers 13 and 14 which may be connected in loop fashion through the processing elements 11 or in interchange fashion with respect to the loop adjacent thereto.

The two loop connection states selectable within a processing element 11 are designated as the through state and the interchange state which are illustrated in FIG. 3. Referring to FIG. 3, the solid lines within each processing element 11 represents the through state which isolates the two storage loops 10 incident therewith. The dashed lined arrows within the processing elements 11 indicate the interchange state which, if maintained for one complete rotation of the contents of the loops incident therewith, effects an interchange of the contents of these loops. The interchange connection, if maintained indefinitely, effectively joins the two incident loops into a single loop of double length. By causing $k-1$ contiguous processing elements to maintain the interchange connection, a storage loop of size $k$ times the basic loop size is formed. A processing element 11 is designated as inactive if it merely maintains the interchange connection indefinitely and is designated as active otherwise. The pattern of active (denoted A) and inactive (denoted I) processing elements (PE) is restricted to be of the form:

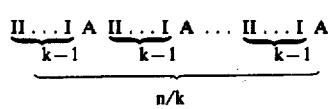

Active PE's are considered divided into two phases - odd and even. The odd phase comprises the first, third, fifth ... active PE's and the even phase comprises the remaining PE's.

Referring again to FIG. 1, it is appreciated that processing element $PE_i$ is incident with storage loops $L_i$ and $L_{i+1}$ such that each processing element 11 is coupled with two adjacent loops 10 and each of the loops 10 is coupled to two processing elements 11 at points on the loop that are spaced one-half loop length from each other.

Data and memory manipulation control signals are applied to the memory module of FIG. 1 via broadcast control lines 15 and chain control lines 16 which comprise means for coupling the control signals to the processing elements 11. The broadcast control lines 15 apply memory mode, key field, key and update data defining signals as well as other control signals in parallel to all of the processing elements 11. The chain control lines 16 are connected serially through the processing elements 11 and the information carried thereby may be modified by $PE_i$ before being transmitted to $PE_{i+1}$. The activity status is assigned to the PE's via the chain control lines 16. The broadcast control signals are primarily rendered operative only at active PE's and the broadcast control signals designated odd or even are rendered operative only at active PE's belonging to the odd or even phase respectively. A response line 17 provides an OR function with respect to the responses from all of the active PE's in the module. The first loop of the memory module and the unconnected lines of the last PE in the module provide data ports 20 and 21 respectively. When two or more modules are utilized in a memory system, identical broadcast control signals are applied to each in parallel and the response signals from each module are connected in an OR function. The plural modules are coupled in series with respect to their chain control lines and data ports, special terminations being required at the data port extremities.

The following Table 1 lists the broadcast control modes and mode aggregates:

TABLE 1

| SORT < | } SORT | | |
|---|---|---|---|
| SORT > | | } | |
| SEARCH = | | | COMP |
| SEARCH > | } SEARCH | | |
| SEARCH < | | | |
| UPDATE | | | |
| IDLE | | | |
| RECONFIGURE | | | |

It is, therefore, appreciated that the memory in accordance with the present embodiment of the invention can, in addition to the data storage function, perform an ascending or descending sort of the contents of the memory as well as an associative search of the contents of the memory for records that are equal to or greater than a given key. The memory can also update the contents with new data and can also reconfigure itself with regard to number and size of the circulating data loops. In the IDLE mode the memory performs the conventional data storage function. As is appreciated from Table 1, the ascending and descending sort modes form a sort mode aggregate and the three search modes form a search mode aggregate; with the sort and search mode aggregates forming a compare mode aggregate.

The following Table 2 lists the individual broadcast control signals, chain control and response signals at the module level:

TABLE 2

| BROADCAST CONTROL: | |
|---|---|
| KFE | Key Field - Even |
| KFO | Key Field - Odd |
| KTUE | Key, Tag, Update - Even |
| KTUO | Key, Tag, Update - Odd |
| MODE | (Assumes one of the eight values listed in Table 1) |
| NR | Next Response |
| DSR | Disable Static Retrieval |
| CHAIN CONTROL: | |
| $A_o$, An | PE Activation |
| $SS_o$, SSn | Successful Search |
| RESPONSE | |
| R | Search Response, Sort Completion |

It is thus appreciated that the broadcast control lines 15 comprise nine lines, three of which are utilized to broadcast the binary coded value for one of the eight modes listed in Table 1. The KFE and KFO signals each require one line to transmit field defining pulses to the even and odd phase of the PE's when the bits of the desired data field are traversing the associated PE's. The KTUE and KTUO signals each require one line for transmitting the desired key or update data or tag field defining pulse to the associated odd and even PE's. The NR and DSR signals each require one line for performing functions with regard to record retrieval in a manner to be described.

It is further appreciated from Table 2 that the chain control lines 16 comprise two conductors, one for the PE activation signals $A_0$, $A_1$, ... $A_n$ and the other for successful search signals $SS_0$, $SS_1$, ..., $SS_n$. The response line 17 comprises a single conductor to provide a sort completion signal for the module or to serially provide one or more data records tagged as the result of a search procedure.

Figure 4:
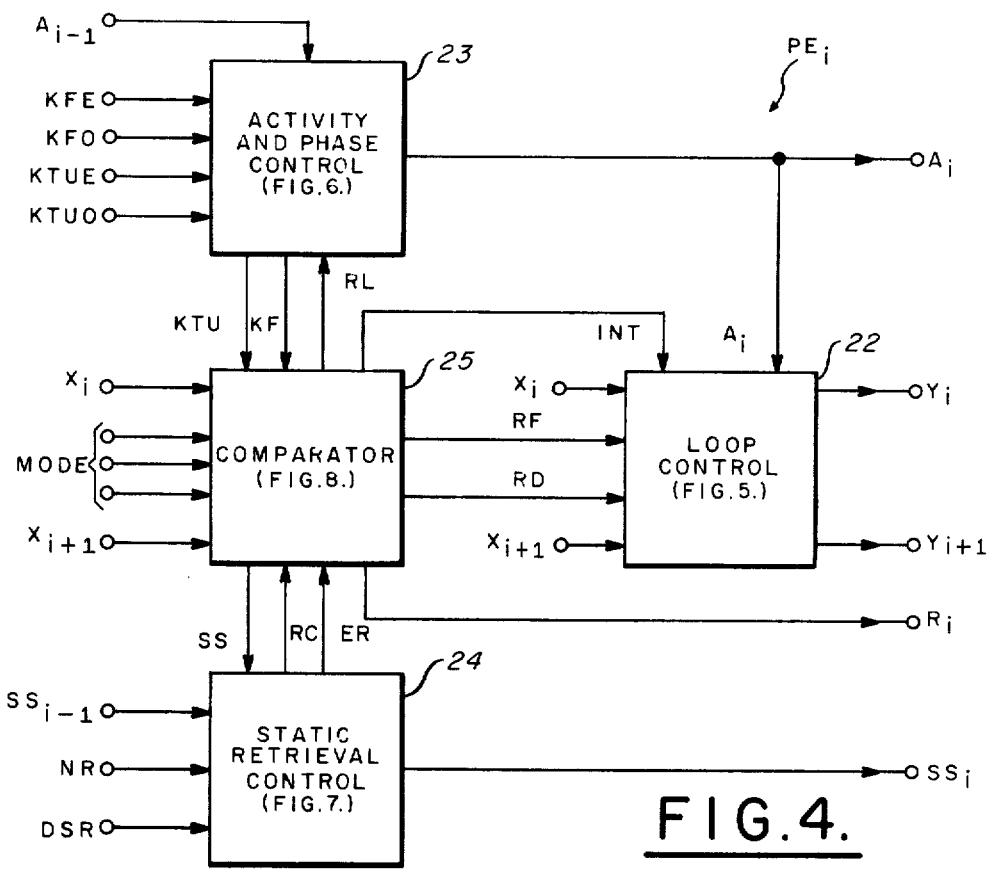
FIG. 4 is a schematic block diagram illustrating further details of a processing element of FIG. 1.

Referring now to FIG. 4, a schematic block diagram of a processing element 11 of FIG. 1 (for example, $PE_i$) is illustrated. The processing element $PE_i$ is comprised of a loop control portion 22, and activity and phase control portion 23, a static retrieval control portion 24, and a comparator portion 25. The broadcast and chain control signals applied to the processing element $PE_i$ as well as the response signal therefrom are defined above with regard to Table 2. The signals internal to $PE_i$, as indicated by the legends, are defined in accordance with Table 3 as follows:

TABLE 3

| KF | KEY FIELD |
|---|---|
| KTU | KEY, TAG, UPDATE |
| Xi | INPUT FROM ⎫ Storage Loop Li |
| Yi | OUTPUT TO) ⎭ |
| SS | SEARCH SUCCESSFUL |
| INT | INTERCHANGE |
| RF | REPLACEMENT FIELD |
| RD | REPLACEMENT DATA |
| Ai | $PE_i$ ACTIVE |
| SSi | SUCCESSFUL SEARCH BY $PE_j$, FOR SOME $j \leq i$ |
| ER | ENABLE RESPONSE |
| RC | RESET COMPARATOR |
| RL | RECONFIGURE LOOPS |
| Ri | RESPONSE FROM $PE_i$ |

The loop control 22 receives data inputs $X_i$ and $X_{i+1}$ from incident loops $L_i$ and $L_{i+1}$, respectively, and provides respective outputs $Y_i$ and $Y_{i+1}$ to these loops. The loop control 22 receives the activity signal $A_i$ from activity and phase control 23 as we as the interchange signal INT, the replacement field signal RF and the replacement data signal RD from the comparator 25. The loop control 22 maintains an appropriate loop connection state between incident loops $L_i$ and $L_{i+1}$ as a function of INT and $A_i$, and utilizes signal RF to control the insertion of replacement data from the line RD into the loop $L_i$ in the data field thereof defined by the signal on the line RF.

Figure 5:
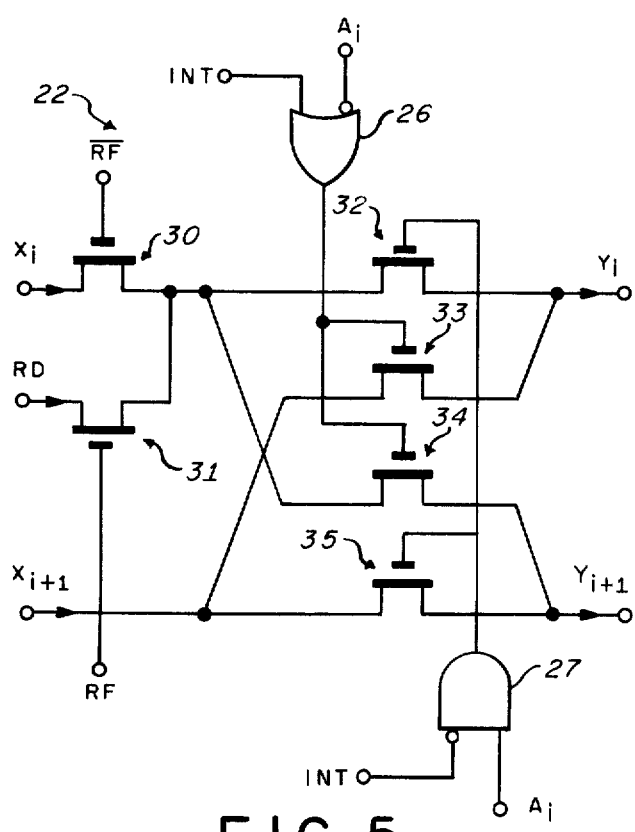
FIG. 5 is a schematic circuit and logic diagram of the loop control portion of the processing element of FIG. 4.

Referring for the moment to FIG. 5, a schematic circuit and logic diagram for the loop control 22 is illustrated utilizing the symbology of MOSFET transmission gates. The loop control 22 is comprised of an OR gate 26 responsive to the INT signal and the complement of the $A_i$ signal and an AND gate 27 responsive to the $A_i$ signal and the complement of the INT signal. The loop control 22 is further comprised of field effect transistors (FET) 30-35. When RF is low, transistor 30 is rendered conductive and transistor 31 is rendered non-conductive thereby transmitting the record data $X_i$. When, however, signal RF goes high defining a replacement data field, transistor 31 is rendered conductive and transistor 30 is rendered non-conductive thereby transmitting the replacement data RD to loop $L_i$. When the signal $A_i$ is low, rendering the processing element $PE_i$ inactive, the AND gate 27 is disabled and the OR gate 26 is enabled thereby rendering the transistors 32 and 35 non-conductive and the transistors 33 and 34 conductive. Under this condition, the $X_i$ input is connected to the $Y_{i+1}$ output and the $X_{i+1}$ input is connected to the $Y_i$ output thereby joining the incident loops $L_i$ and $L_{i+1}$. When, however, the signal $A_i$ is high, rendering the associated processing element $PE_i$ active, the states of the transistors 32-35 are controlled by the interchange INT signal. When INT is high, the AND gate is disabled and the OR gate 26 is enabled thereby rendering the transistors 33 and 34 conductive and switching the loop control 22 into its interchange state. When, however, the signal INT is low, the OR gate 26 is disabled and the AND gate 27 is enabled rendering the transistors 32 and 35 conductive and thereby switching the loop control 22 to its through state.

Referring again to FIG. 4, the activity and phase control 23 maintains the activity status and computes the phase for the processing element $PE_i$. The activity and phase control 23 receives the chain control signal $A_{i-1}$ and transmits the chain control signal $A_i$ to the loop control 22 as well as to the next following processing element $PE_{i+1}$. The activity and phase control 23 is also responsive to the broadcast control signals KFE, KFO, KTUE, and KTUO and transmits the KFE or KFO signal on the line KF to the comparator 25 and the KTUE or KTUO signal on the line KTU to the comparator 25 according to whether the processing element $PE_i$ is of the even or odd phase respectively. The activity and phase control 23 also receives a memory reconfigure signal RL from the comparator 25.

Figure 6:
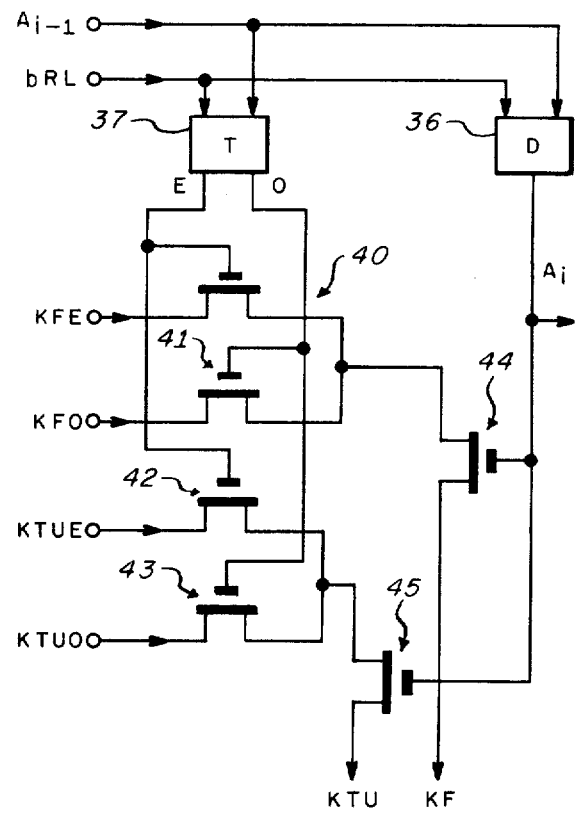
FIG. 6 is a schematic circuit and logic diagram of the activity and phase control portion of the processing element of FIG. 4.

Referring for the moment to FIG. 6, a schematic circuit and logic diagram of the activity and phase control 23 is illustrated. The activity and phase control 23 comprises a delay flip-flop 36 and a trigger flip-flop 37 as well as field effect transistor gates 40-45. In the reconfigure mode, the comparator 25 provides a pulse signal RL to the activity and phase control 23 from the leading edge of which a pulse signal bRL is derived by conventional means (not shown) which is utilized to reset the flip-flops 36 and 37. By further conventional means (not shown) the gating signal RL gates a clock signal to the flip-flops 36 and 37 which shifts in the activity word on the chain control line 16 (FIG. 1). Thus, the delay flip-flop 36 forms one cell of an activation register into which the activity word is shifted under control of the clock gated by RL when the memory is in the reconfigure mode. The trigger flip-flop 37 determines the phase of $PE_i$ by computing the parity of the portion of the activation word that has been shifted through the flip-flop 36. If the bit $A_i$ of the activation word is high (indicating that $PE_i$ is active), the transistors 44 and 45 are rendered conductive. If, however, the activation bit $A_i$ is low (indicating that $PE_i$ is inactive), the transistors 44 and 45 are rendered non-conductive.

As a result of the aforementioned parity computation, either the E output or the O output of the flip-flop 37 will be high determining the phase of $PE_i$. If the processing element $PE_i$ is of the even phase, the transistors 40 and 42 are rendered conductive thereby transmitting the KFE and KTUE signals through the transistors 44 and 45 to the KF and KTU inputs, respectively, of the comparator 25 (FIG. 4). If, however, the processing element $PE_i$ is of the odd phase, the transistors 41 and 43 are rendered conductive transmitting the KFO and KTUO signals to the KF and KTU inputs, respectively, of the comparator 25.

Referring again to FIG. 4, the static retrieval control 24 of the processing element $PE_i$ is coupled to receive the chain control signal $SS_{i-1}$ from the processing element $PE_{i-1}$, the broadcast control signals NR and DSR and SS signal from the comparator 25 and provides as combinational functions of its inputs, the chain control signal $SS_i$ to the processing element $PE_{i+1}$ and the signals RC and ER to the comparator 25. The combinational functions are formed in accordance with the following equations:

$$SS_i = SS_{i-1} + SS$$
$$ER = \overline{SS_{i-1}} \; SS + DSR \quad (1)$$

$$RC = NR \cdot \overline{SS_{i-1}} \cdot SS$$

The static retrieval control 24 determines if $PE_i$ is a first responder during search operations.

Figure 7:
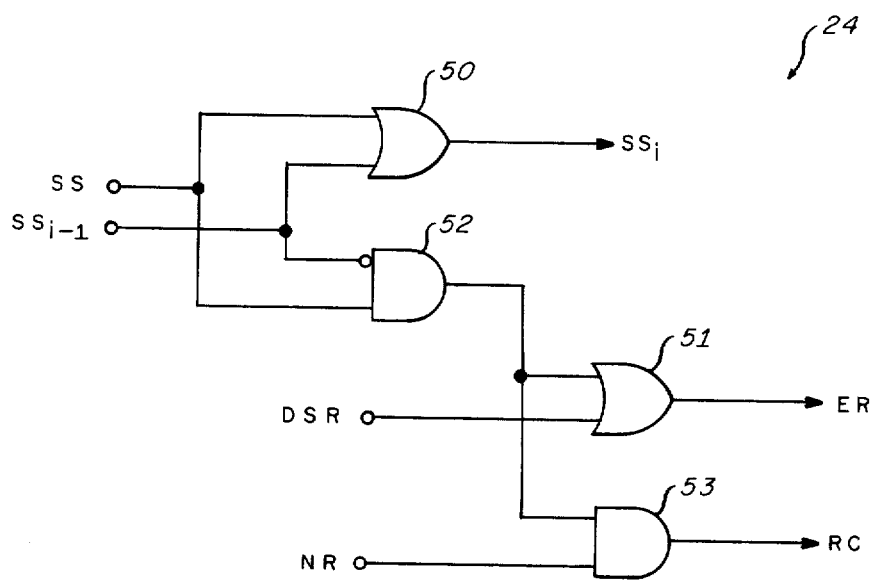
FIG. 7 is a schematic logic diagram of the static retrieval control portion of the processing element of FIG. 4.

Referring now to FIG. 7, a schematic logic diagram of the static retrieval control 24 is illustrated. The static retrieval control 24 is implemented by OR gates 50 and 51 and AND gates 52 and 53. The gates 50-53 are interconnected in a conventional manner to implement the combinational logic functions of equations (1).

Referring again to FIG. 4, the comparator 25 of the processing element $PE_i$ is coupled to receive the broadcast mode signals from the lines 15 of FIG. 1 as well as inputs from the incident circulating storage loops $L_i$ and $L_{i+1}$, which inputs are designated as $X_i$ and $X_{i+1}$. The comparator 25 further receives the KTU and KF signals from the activity and phase control 23 as well as the RC and ER signals from the static retrieval control 24 and provides the RL signals to the activity and phase control 23, the SS signal to the static retrieval control 24, the INT, RF and RD signals to the loop control 22 and the $R_i$ signal to the response line 17 of FIG. 1. The comparator 25 performs series comparisons either between the data stored in the incident loops $L_i$ and $L_{i+1}$ or between the data stored in loop $L_i$ and the data transmitted by the KTU signal and computes the delineated internal control signals in accordance therewith.

Figure 8:
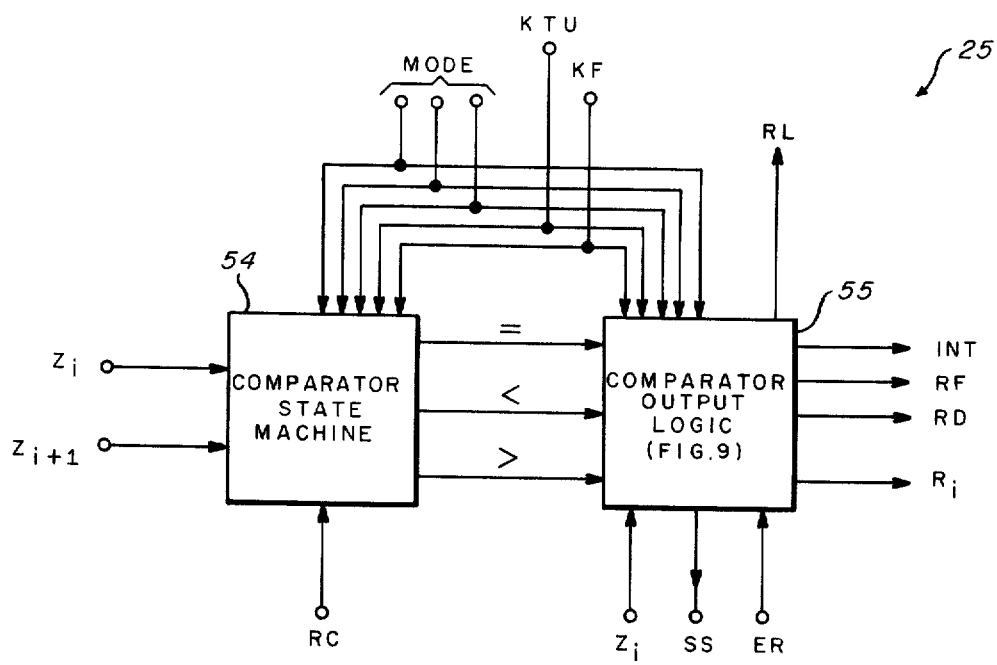
FIG. 8 is a schematic block diagram of the comparator portion of the processing element of FIG. 4.

Referring now to FIG. 8, a schematic block diagram of the comparator 25 of the processing element $PE_i$ is illustrated. The comparator 25 is comprised of a comparator state machine 54 and comparator output logic 55. The comparator state machine 54 computes a sequential function of its inputs $Z_i$, $Z_{i+1}$, MODE, KTU, KF, and RC and has four internal states denoted REST, EQUAL ( = ), LESS THAN (<), and GREATER THAN (>). The outputs =, < and > from the comparator state machine 54 are derived directly from the three corresponding states thereof in a conventional manner. The comparator state machine 54 is a sequential logic machine which may readily be configured in accordance with the well known precepts of sequential logic theory as explained, for example, in the textbook "Switching and Finite Automata Theory" by Zvi Kohavi, published by McGraw-Hill Book Company in 1970. A further appreciation for the discipline of sequential logic theory may be had from the textbook "Finite State Models for Logical Machines" by F. C. Hennie, published by John Wiley and Sons, Inc. in 1968. The comparator state machine 54 is designed in accordance with the discipline of sequential logic theory from the following transition logic table:

TABLE 4

| PRESENT STATE | NEW STATE | | | |
|---|---|---|---|---|
| | REST | = | < | > |
| = | REST | 0 | bKF · COMP | — | — |
| | bKF · IDLE +RC | 0 | $Z_i \cdot Z_{i+1} \cdot KF \cdot$ COMP | $Z_i \cdot Z_{i+1} \cdot KF \cdot$ COMP |
| < | bKF · IDLE +RC | bKF · COMP | 0 | — |
| > | bKF · IDLE +RC | bKF · COMP | — | 0 |

The dashed entries in Table 4 represent forbidden transitions while the entry φ denotes any combination of input values other than those satisfying the given transition logic equations. The inputs $Z_i$ and $Z_{i+1}$ to the comparator state machine 54 are derived in a conventional manner in accordance with the following logic equations:

$$Z_i = X_i$$
$$Z_{i+1} = X_{i+1} \cdot SORT + KTU \cdot SEARCH \qquad (2)$$

Thus it is appreciated that the input $Z_{i+1}$ to the comparator state machine 54 is $X_{i+1}$ when MODE is SORT and is KTU when MODE is SEARCH, and that the input $Z_i$ independently of MODE. It will further be appreciated that the signal bKF in Table 4 is a pulse signal that coincides with the leading edge of the KF signal and is derived by conventional circuitry (not shown) within the comparator state machine.

The comparator output logic 55 provides the output signals SS, INT, RF, RD, RL and $R_i$ as combinational functions of the input signals MODE, KTU, KF, =, <, >, $Z_i$ and ER in accordance with the following logic equations:

$$SS = (SEARCH =) \cdot ( = ) + (SEARCH <) \cdot (>) + (SEARCH >) \cdot (>)$$
$$INT = (SORT<) \cdot (>) + (SORT>) \cdot (<)$$
$$RF = \overline{KF} \cdot KTU \cdot SEARCH + KF \cdot UPDATE \cdot ( = ) \qquad (3)$$

$$RD = \overline{KF} \cdot SS + KF \cdot KTU$$
$$RL = RECONFIGURE$$
$$R_i = Z_i \cdot SS \cdot ER + INT$$

Figure 9:
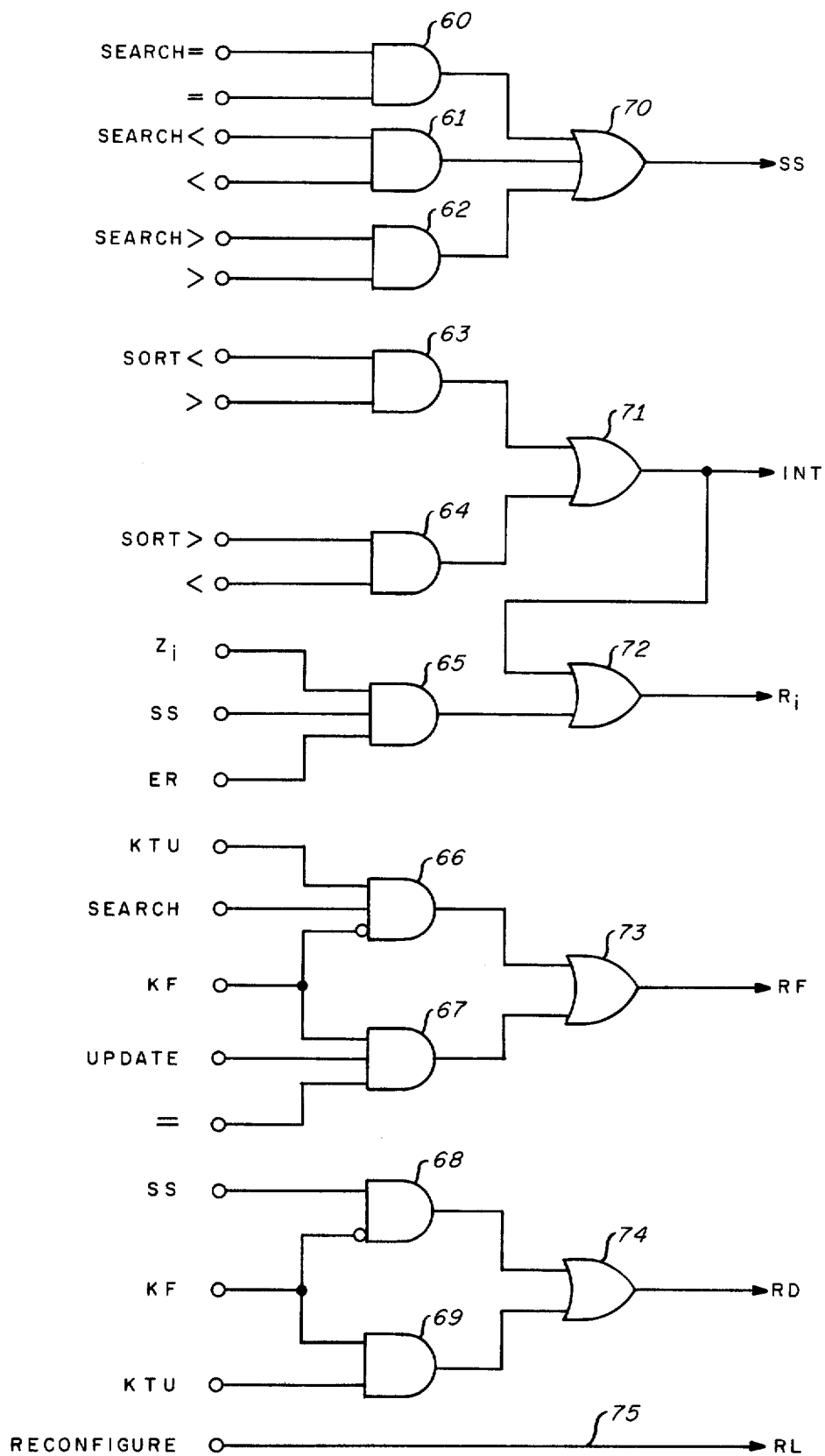
FIG. 9 is a schematic logic diagram of the comparator output logic of FIG. 8.

The logic equations (3) are implemented in a conventional manner as illustrated in FIG. 9 by AND gates 60–69 and OR gates 70–74 interconnected as illustrated as well as by line 75 providing the RL signal.

The logic functions described hereinabove may be instrumented in any technology in which serial memories (shift registers) and general logic are available. Typically, serial memories which may be utilized are magnetic bubble domain shift registers, CCD or bucket brigade shift registers, standard flip-flop shift registers in any logic family, or moving-medium magnetic memories.

Typical logic implementations may include TTL, ECL, MOS and other standard logic families. It is appreciated that it would be advantageous to implement both the serial memory and the PE logic in the same technology so that they may be integrated one one chip. Many such instrumentations are possible, including MOS-CCD combinations, integrated-injection logic, magnetic domain technology as well as others.

In the operation of the above-described embodiment of the intelligent memory of the present invention, six primary modes are provided: namely, SORT, LOAD/UNLOAD, SEARCH, RETRIEVE, UNDATE, and RECONFIGURE. In the ensuing operational descriptions, performance expressions are provided with respect to the following memory parameters:

Loop Size $l$ bits
One Bit Transfer Time $t$ sec.
Loop Cycle Time $r = lt$ sec.
Number of Loops $n$ As previously described, broadcast signals, KFE, KFO, KTUE and KTUO are applied to the processing elements of the memory. Signals KFE (Key field-even) and KFO (Key field-odd) define the arbitrary block of contiguous bit positions on which a sort or search is to be performed or which is to be updated. There are two such signals since the PE's are divided into two groups or phases, even and odd, which receive any specified group of bits at times $lt/2$ apart as may be appreciated from FIG. 1.

Signals KTUE (Key, tag, update-even) and KTUO (Key, tag update-odd), are also divided into two phases in a mannner similar to that described for the KF signals. The KTUE and KTUO signals have multiple uses. During a SORT they are not utilized and during a SEARCH the portion of KTU gated by KF provides the search key, and any "ONES" in KTU outside of KF define a tag field, in which the result of the search (signal SS, i.e., SEARCH SUCCESSFUL) is deposited. During an UPDATE, KTU provides the update data.

To perform a SORT operation, the control inputs to the memory comprise the sort key field definition signals KFE and KFO and the broadcast control mode signal equal to either SORT <, or SORT >, depending upon whether an ascending or descending sort of the memory contents is desired. The externally specified sort key field may comprise any block of 1, to $l$ contiguous bit positions. The operation of an active processing element, for example, $PE_i$, during one complete cycle of its incident loops $L_i$ and $L_{i+1}$ is as follows. The cycle begins when the key field portions of the data records, which are stored, for example, one record per loop, enter $PE_i$, high order bits first. When the leading edge of the KF signal enters the comparator state machine 54 (FIG. 8), the bKF pulse is generated which sequences the comparator state machine 54 to the equal state. That is appreciated from Table 4, supra, since irrespective of the present state of the comparator state machine 54, the machine will sequence to its equal state in response to the conjunctive combination of the bKF pulse and the COMP mode. It is appreciated that straightforward logic circuits (not shown) within the comparator state machine 54 respond to the broadcast mode signals SORT <, SORT >, SEARCH =, SEARCH > and SEARCH < to provide SORT, SEARCH and COMP logic signals in accordance with Table 1, supra. When the comparator state machine 54 is in the equal state and a SORT mode is broadcast, the INT line of the comparator output logic 55 is low which places the loop control circuit 22 (FIGS. 4 and 5) in the through state.

The sort cycle continues with the key field portions of the data records from the incident loops $L_i$ and $L_{i+1}$ entering $PE_i$ high order bits first. As long as the two bit streams remain equal, $PE_i$ maintains the through connection state. The first mixed pair of bits causes $PE_i$ to assume either the through state or the interchange state, whichever routes the zero bit to $L_i$ if SORT < is specified, or to $L_{i+1}$ if SORT > is specified and to maintain that connection state for the remainder of the sort cycle. Equal key fields cause $PE_i$ to maintain the through connection for the full loop rotation. This may be appreciated from Table 4 where it is noted that when the comparator state machine 54 is in the present state =, the COMP mode SORT < or SORT > is broadcast and the KF signal is high, a mixed pair of bits will cause the comparator state machine 54 to assume either the < or the > state in accordance with the transitional logic delineated in the table. Equations (3) indicate that the INT (interchange) signal will be high or low in accordance with the INT equation thereby setting the loop control of $PE_i$ into either the through or the interchange state dependent upon the requirements of the sort and the incident data. Once the comparator state machine 54 enters either the < or the > state, during a COMP mode, it must remain in that state until the next occurring KF cycle. This is appreciated from Table 4 where it is noted that when the present state is either < or >, the machine requires the next occurring bKF pulse to sequence back to the equal state.

At any instant of time during the sort, a data record may be distributed over as many as three contiguous loops. The memory correctly performs a stable sort of its contents on the specified key field, either ascending or descending in accordance with the sort mode that is broadcast and provides a sort completed signal on the response line 17 (FIG. 1) upon completion thereof. The sort completion signal is generated by straightforward logic (not shown) that detects that the response line 17 has remained low during one complete loop rotation when a sort mode is broadcast. This is appreciated from the $R_i$ equation of equations (3) supra where it is noted that $R_i$ is high whenever any comparator provides an interchange signal during a loop rotation in the sort mode. It is only when all of the data records have been properly ordered that all of the active PE's remain in the through state for a complete loop rotation.

The maximum sort time is $nr/2$ seconds. Multiple key and non-contiguous key sorts are performed by repetition of the basic single-key stable sort.

In the search mode of operation, the broadcast control inputs to the memory comprise the search key field definition signals KFE and KFO, the search key signals KTUE and KTUO, and the broadcast mode signal equal to SEARCH =, SEARCH <, or SEARCH >.

The externally specified search key field may comprise any block of 1 to $l$ contiguous bit positions. The KTUE and KTUO signals provide the search key and define the tag bits into which successful search results are written. It is appreciated from the INT equation of equations (3) supra that all of the active processing elements remain in the through state throughout the search procedure. The operation of an active processing element $PE_i$ during one complete cycle of its incident loop $L_i$ is as follows: When the KF signal is initially applied to the comparator state machine 54 (FIG. 8), the bKF pulse coincident with the leading edge of the KF pulse sequences the comparator state machine 54 to the = state in a manner similar to that described above with respect to the sort mode. The processing element $PE_i$ compares the data on $L_i$ to the search key on line KTU during the interval defined by KF and classifies the data according to whether it is equal, less than or greater than the key. The classification is registered via the internal state of the comparator state machine 54 of FIG. 8. The comparator state machine 54 switches to and holds the appropriate state in a manner similar to that described above with regard to the sort mode. If the registered classification agrees with the broadcast control search mode, the signal SS is raised in accordance with the SS equation of equations 3. Whether or not the search is successful for $PE_i$, after KF drops, SS may be written into loop $L_i$ as a response or tag bit in the field specified by KTU. This is appreciated from the output connections RF and RD from the cmparator output logic 55 of FIG. 8 to the loop control 22 of FIG. 5 in accordance with the logic equations RF and RD of equations (3) supra. The average search time is $3r/2$ seconds including writing the response bit.

By invoking appropriate sequences of search operations, compound and multiple key searches can be performed. For example, three search operations implement a "between-limits" search. The search operations described herein form a functionally complete set. If $S_1$ and $S_2$ are any two search operations or sequences of search operations that can be performed by the memory, and if $t_1$ and $t_2$ are the corresponding response bits, then logical operators ¬ (negation), $\wedge$ (conjunction), and V (union) applied to $S_1$ and $S_2$ may be implemented by secondary search operations as follows:

| | |
|---|---|
| $S_1 \wedge S_2$ | $t_1 t_2 = $ '11' |
| $S_1$ V $S_2$ | $t_1 t_2 > $ '00' |
| ¬$S_1$ | $t_1 = $ '0' |

Direct hardware interpretation of complex data base queries is rendered possible by the above described search operations.

The data records tagged as a result of a successful search as described above can be retrieved from the memory. There are two classes of retrieval problems: unique response retrieval and multiple response retrieval. In the former case, responding records, if they exist, are known to be unique; in the latter case they need not be. For example, for a SEARCH = operation in a file of records involving license plate numbers or social security numbers, if a successful search is indicated with regard to a particular license plate or social security number search key, the response is unique. If, however, the search is in a file of, for example, customer records including customer names, a search for a particular last name would not necessarily provide a unique response.

For unique response retrieval, the broadcast control line DSR is raised. Immediately following a successful search, the responding record is routed directly and persistently to the memory response output line 17 (FIG. 1). This is appreciated from the $R_i$ equation of equations (3), the ER equation of equations (1), the static retrieval control 24 of FIG. 4 and the comparator output logic 55 of FIG. 8. When DSR is raised, ER goes high and since SS is high by reason of the successful search, equation $R_i$ indicates that the comparator input, $Z_{i_b}$ is routed to the response line $R_i$ of the associated processing element. Since the loop $L_i$ is applied to the $Z_i$ input of the comparator output logic 55 (FIG. 8), the $R_i$ equation of equations 3 indicates that this record is routed to the response line. The total average response time is $3r/2$ seconds.

When it is expected that the response to a search will not be unique, a multiple response data record retrieval procedure is utilized. There are two such procedures associated with the present embodiment namely, static multiple response retrieval and dynamic multiple response retrieval. In static multiple response retrieval there is no interloop data movement. In order to statically retrieve multiple response records, the broadcast control signal DSR is held low. After a suitable waiting period T following a search operation, the output ER of the static retrieval control 24 (FIGS. 4 and 7) is high for at most one of the processing elements $PE_i$. If such a $PE_i$ exists, it is the processing element having the smallest index among those performing a successful search. The responding record on the associated loop $L_i$ is routed persistently to the memory output response line 17 (FIG. 1). This is appreciated from the $SS_i$ and ER equations of equations (1), the $R_i$ equation of equations (3) and from FIGS. 1, 4 and 7. After a search operation, SS is high at all of the PE's with successfully responding records. Since SS is a chain control signal, it is appreciated that all $PE_i$ with index greater than the smallest index among those PE's performing a successful search, will have high input $SS_{i-1}$ signal which drives ER low for those PE's. It is only the PE having the smallest index that has a low $SS_{i-1}$ input such that its ER Line is high. Thus, it is appreciated from the $R_i$ equations of equations 3 that the record associated with the PE of smallest index among those performing a successful search is provided to the response line 17 (FIG. 1). The waiting period T must be at least as large as the time for a signal to propagate a synchronously through the complete chain of static retrieval controls 24 which time conservatively may be taken as $nt$ seconds. The total response time is $3r/2 + nt + r = nt + 5r/2$ seconds.

Retrieval of successive responses are triggered by pulsing the NR broadcast control input to the static retrieval controls 24 of all of the PE's. This is appreciated from the RC equation of equations (1) and from Table 4 in that only the RC line from the PE having the smallest index among those performing a successful search goes high, sequencing the associated comparator state machine 54 to the REST state which, in turn, drops the associated SS signal. This permits the ER signal to then operate in the manner described above on the PE having the second smallest index among those performing a successful search. Thus by successively pulsing the NR input, all of the successful search records are routed to the response line 17 in increasing order of index. Retrieval of the $k^{th}$ response $k \geq 2$, requires an additional $(n-k+1)t+r$ seconds.

Static retrieval response time can be substantially reduced by segmenting the memory at retrieval time and polling the memory segments for a response. In this case, total response time for the first retrieval is approximately $nt/s + 5r/2$ seconds, where $s$ is the number of equal length memory segments. The response time may be minimized by selecting $s = \sqrt{n}$.

In the dynamic multiple response data record retrieval procedure, a sort operation, as described above, is invoked following the search operation and utilizing the search response bit as the sort key. One of the two memory data ports 20 or 21 (FIG. 1) is selected as the retrieval port and the appropriate sort operation, SORT $<$ or SORT $>$, is used to drive responding records to the output terminal of the selected retrieval port. Conventional additional logic, (not shown) at the retrieval port, may be utilized to reset the response bit in a responding record as it arrives at the output terminal and to re-load the modified record via the input terminal of the selected retrieval port. This assures that all responding records will be both retrieved and preserved within the memory for subsequent operations. The average total response time for the first retrieval is approximately $nr/4$ seconds. As discussed above with respect to the static retrieval procedure, the response time for dynamic retrieval can be shortened by segmenting the memory at retrieval time.

The memory may be cleared of all data by broadcasting mode IDLE and raising signals KFE and KFO in order to reset all of the comparator state machines 54 (FIG. 8) of all of the PE's to the REST state (table 4). The signals KFE and KFO are then dropped, mode SEARCH = is broadcast, and KTUE and KTUO are raised for one full loop cycle. That the memory is cleared by utilizing this procedure is appreciated from the RF and RD equations of equations (3) and from the loop control circuit of FIG. 5. By the application of the signals as described, the replacement field signal RF goes high, whereas the replacement data signal RD goes low. Thus, it is seen in FIG. 5 that zero data is routed through the transistor 31 to fill the entire data record $L_i$ with zeros. Since the signals are broadcast to the entire memory, zero is loaded into every bit position thereof. The entire clearing sequence requires approximately $r+t$ seconds.

Data files may be loaded into or unloaded from the memory by utilizing one of the two data ports as the load or unload port an appropriately terminating the other port. The memory is initially cleared as described and memory loading is achieved by invoking the appropriate sort operation with a key field spanning any data field known to be non-zero which may be the entire record. The file is presented serially at the input terminal of the load port.

Memory unloading is performed in a similar manner. An appropriate constant, 0 or 1, is presented at the input terminal of the unload port, a sort operation is initiated, and the file appears serially at the output terminal of the unload port.

Loading or unloading the entire memory requires $nr$ seconds. Concurrent loading and unloading is possible whenever the load file has a data field whose values are uniformly less than or greater than the values assumed by the corresponding data field in the unload file. This condition may be effected independently of the data by dedicating a single bit in each file for this purpose. Concurrent loading and unloading of the entire memory requires $nr$ seconds.

The time to load may be further reduced by partitioning the memory into a number of segments and loading the segments in parallel from a like number of data sources. The same consideration applies to unloading the memory into a like number of data sinks.

A replacement update may be performed in parallel on all records responding to any sequence S of one or more search operations and tagged, say in bit $t$. A search operation for $t = 1$ is performed in order to sequence the associated comparator state machines 54 (FIG. 8) to the = state. This is followed by a mode transition to UPDATE. The update itself is broadcast on lines KTUE and KTUO along with update field information on lines KFE and KFO. The details of the UPDATE procedure may be appreciated from equations RF and RD of equations (3) and the loop control schematic diagram of FIG. 5. The average total update time is $5r/2$ seconds.

The "shape" of the memory may be transformed to accommodate various record sizes in a RECONFIGURE operation. With $n$ basic storage loops of size $l$ bits, reconfiguration to $n/k$ loops of size $kl$ bits for any $k$, $1 \leq k \leq n$, is possible. The reconfiguration is controlled by broadcasting the RECONFIGURE mode signal on the broadcast control mode lines (FIG. 1) and applying an appropriate activation word to the chain control line 16. The details of the reconfiguration procedure was described above with regard to the activity and phase control 23 as discussed with respect to FIGS. 4 and 6. SORT, LOAD/UNLOAD, SEARCH, RETRIEVE and UPDATE operations apply to all shapes of the memory.

Figure 10:
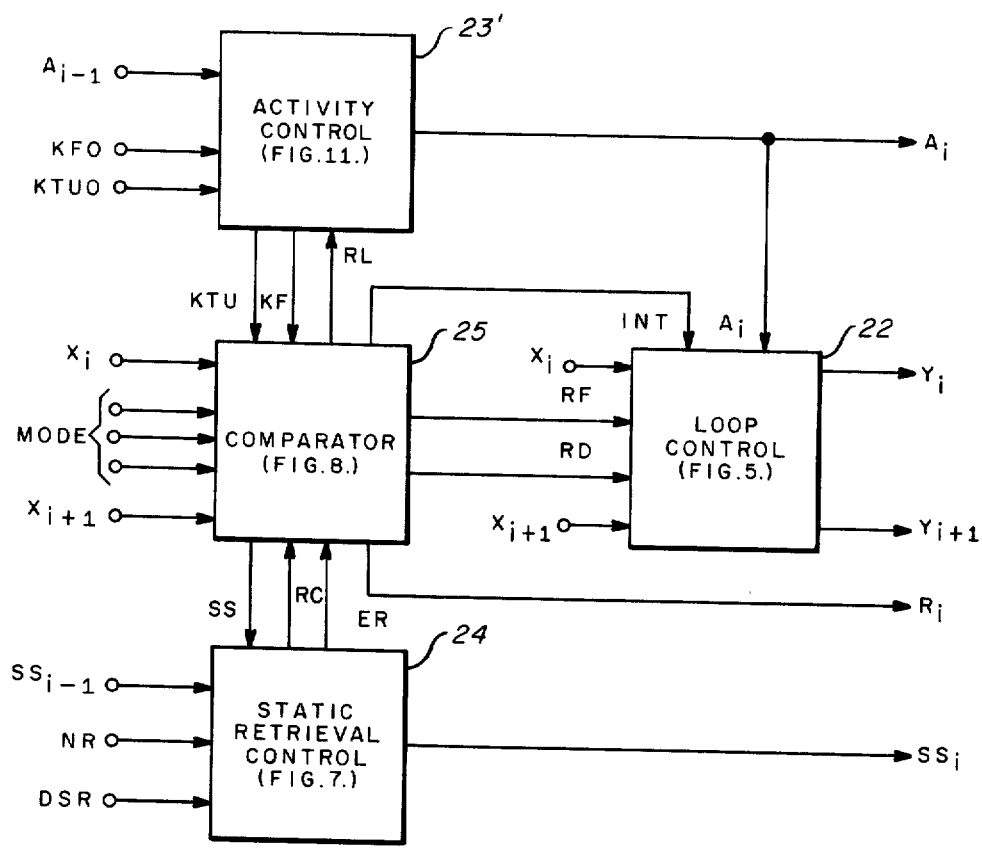
FIG. 10 is a schematic block diagram illustrating an alternative arrangement for the processing element of FIG. 1.
Figure 11:
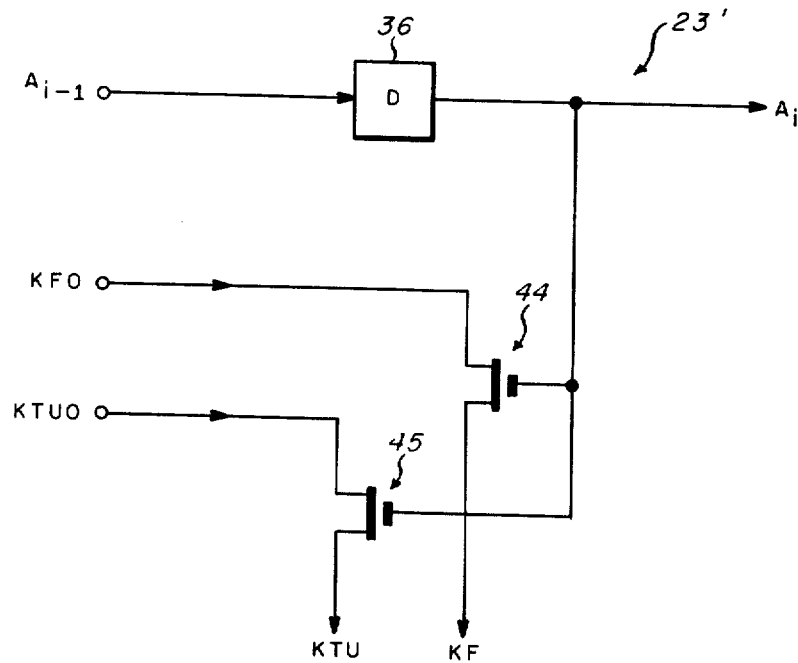
FIG. 11 is a schematic circuit and logic diagram illustrating an alternative arrangement for the activity control portion of FIG. 4.

A simplification of the above-described embodiment of the invention may be effected with regard to the processing elements $PE_i$, such that $i$ is odd and only to these. It is appreciated that such processing elements, when active, must belong to the odd phase. This will be true for all memory shapes. Thus the broadcast control signals KFE and KTUE need not be provided to these PE's. Specifically with regard to FIG. 4, these signals need not be applied and the activity and phase control 23 is redesignated as activity control. Additionally, with regard to FIG. 6, the trigger flip-flop 37 as well as the transistors 40–43 need not be utilized. FIGS. 10 and 11 illustrate these simplifications for odd subscripted PE's with regard to FIGS. 4 and 6, respectively, where the reference numeral 23 has been changed to 23' to designate the simplified portion.

In this simplified embodiment, if $PE_i$ is active, the activity control 23' (FIG. 10) transmits KFO ad KTUO to the comparator 25. In FIG. 11, the delay flip-flop 36 forms one cell of an activation register into which an activity word is shifted under control of a clock gated by RL (not shown) when the memory is in the RECONFIGURE mode in a manner similar to that described above with regard to FIG. 6. The hereinbefore described memory operations of SORT, LOAD/UNLOAD, SEARCH, RETRIEVE, UPDATE and RECONFIGURE, remain unchanged with regard to this embodiment. The simplification results in approximately a 5% reduction in PE chip area without any loss in functionality.

Another simplification may be effected with regard to the above-described embodiment of the invention, by restricting memory configuration to odd multiples of the basic loop length. With this restriction, the simplification applies to all processing elements $PE_i$ such that $i$ is even and only to these. It is appreciated that such processing elements, when active, must belong to the even phase. This applies to all memory shapes in which the reconfigured loop length is an odd multiple of the basic loop length. Thus the broadcast control signals KFO and KTUO are not applied to these PE's.

The resulting modifications are similar to those described above with regard to the odd subscripted PE's. Thus FIGS. 10 and 11 may be utilized in this instance by replacing the KFO and KTUO input signals by KFE and KTUE, repectively. In this embodiment, the hereinabove described memory operations of SORT, LOAD/UNLOAD, SEARCH, RETRIEVE, UPDATE and RECONFIGURE remain unchanged with the exception that with $n$ basic storage loops of size $l$ bits, reconfiguration to $n/k$ loops of size $kl$ bits for any odd $k$, $1 \leq k \leq n$, is possible. This simplification provides an additional 5% reduction in chip area but somewhat restricts memory reconfiguration flexibility.

It will be appreciated that the variety of control signals such as the broadcast control signals KFE, KFO, KTUE, KTUO, NR and DSR as well as the broadcast mode signals SORT<, SORT >, SEARCH =, SEARCH >, SEARCH <, UPDATE, IDLE and RECONFIGURE as well and the chain control activation word $A_0, A_1, \ldots A_n$ are generated and provided by a memory controller (not shown) by any of a variety of known circuit arrangements and techniques. Although the present embodiment of the invention was described in terms of the functions SORT, LOAD/UNLOAD, SEARCH, RETRIEVE, UPDATE and RECONFIGURE, it will be appreciated that other functions may be incorporated in the memory by the inclusion of appropriate circuitry within the processing elements. The memory of the present invention as well as performing the data manipulation and memory reconfiguration functions described above, is also utilized as a basic data store by, for example, switching all of the comparator state machines 54 (FIG. 8) to the REST state (Table 4). Other procedures for effecting basic data storage are appreciated from the foregoing detailed description of the invention.

The aforedescribed embodiments of the present invention may also be utilized for random access operation by reserving a portion of each loop for recording a unique binary address. Thus the aforedescribed search mode, may be utilized with KF defining the address field and KTU providing the desired address. Since the addresses are uniquely coded, a unique response is provided and the address record is retrieved by the aforedescribed unique response retrieval procedure at the response line 17 of FIG. 1. Thus, a random access READ may be performed. A random access WRITE may also be performed by again addressing the desired loop utilizing the search procedure and thereafter entering the UPDATE mode to write into the responding loop.

It will be appreciated that the aforedescribed memory operations of SORT, LOAD/UNLOAD, SEARCH, RETRIEVE, UPDATE, and RECONFIGURE are various combinations of the primitive memory functions of (A) COMPARE, (B) INTERCHANGE, (C)

DATA BROADCAST and (D) RESPONSE COLLECTION as indicated in the followng Table 5:

TABLE 5

| OPERATIONS | PRIMITIVE FUNCTIONS COMPARE | INTERCHANGE | DATA BROADCAST | RESPONSE COLLECTION |
|---|---|---|---|---|
| SORT | X | X | | X |
| LOAD/UNLOAD | X | X | | |
| SEARCH | X | | X | |
| RETRIEVE | X | X | | X |
| UPDATE | | | X | |
| RECONFIGURE | | X | | |

From the foregoing it is appreciated that the present computer memory formed of circulating serial storage loops and distributed processing logic, in addition to performing the basic information storage function, performs off-line sort processing, associating searching, updating and retrieval. The memory is also capable of dynamically changing its loop size to accommodate varying data requirements. As one component of a computer storage hierarchy, the memory has applications in data base processing and storage management. Thus the invention comprises a content addressable, self-sorting restructurable memory which incorporates and controls the primitive functions of serial compare and serial interchange to achieve these capabilities in a single circulating memory device.

It is believed that embodiments of the invention utilizing present day LSI technology will provide a device of comparable expense compared to that of random access memories utilizing the same technology and, furthermore, will provide the additional capabilities described above. Compared with prior art content addressable memories the present memory device offers substantially reduced cost with regard to performance of those functions common to both types of memories.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. Digital memory apparatus for storing and processing digital data comprising
   a plurality of circulating storage loop means for storing and circulating said digital data therein,
   a plurality of data processing circuit means,
   each said data processing circuit means being serially coupled in each of two said circulating storage loop means,
   each said circulating storage loop means being serially coupled through two said data processing circuit means at different points of said loop means respectively, and
   means for coupling data manipulation control signals including a mode defining signal and key field defining signals to said plurality of data processing circuit means,
   each said data processing circuit means including comparator means responsive to said data manipulation control signals and to said digital data circulating in at least one of said two storage loop means associated therewith for performing comparisons with respect to said digital data in accordance with said control signals and loop control means coupled to said comparator means and serially coupled in said two loop means associated therewith for selectively effecting isolating and data interchanging connections between said two loop means,
   wherein said data processing circuit means performs a plurality of data manipulation operations with respect to said digital data in response to said data manipulation control signals as said digital data serially circulates through said data processing circuit means.

2. The apparatus of claim 1 in which each said data processing circuit means comprises
   comparator means responsive to said mode defining signal specifying a sort mode, to said key field defining signals and to said digital data circulating in said two storage loop means associated therewith for performing data comparisons between the data in said two storage loop means in the key fields defined by said key field defining signals and to generate a binary valued interchange signal in accordance with said data comparisons, and
   loop control means serially coupled in said two loop means associated therewith and responsive to said loop interchange signal for effecting an isolating or data interchanging connection between said two loop means selectively in accordance with the respective binary value of said loop interchange signal,
   thereby performing a sort of said digital data circulating in said plurality of circulating storage loop means in response to said sort mode defining signal.

3. The apparatus of claim 2 in which said means for coupling further includes means for coupling a key defining signal to said plurality of data processing circuit means.

4. The apparatus of claim 3 in which said comparator means includes means responsive to said mode defining signal specifying a search mode, to said key field defining signals, to said key defining signal and to said digital data circulating in one of said two storage loop means associated therewith for performing data comparisons between key data provided by said key defining signal and the data in said one storage loop means in the key fields defined by said key field defining signals and to generate a binary valued successful search signal whose binary values are representative respectively of a successful or unsuccessful search in accordance with said data comparisons,
   said comparator means generating said interchange signal to effect said isolating connection in said loop control means when said search mode defining signal is active,
   thereby performing a search with respect to said key data of said digital data circulating in said plurality of circulating storage loop means in response to said search mode defining signal.

5. The apparatus of claim 4 in which
   said comparator means includes means for generating a replacement field signal on a replacement field line, said replacement field signal defining a replacement field of said digital data circulating in said one storage loop means and a replacement data signal on a replacement data line, said replacement data signal defining data to be inserted into said replacement field, and said loop control means includes means responsive to said replacement field line and said replacement data line for inserting said replacement data into said replacement field as said digital data circulates through said loop control means.

6. The apparatus of claim 5 in which said means for coupling further includes means for coupling a tag field defining signal to said plurality of data processing circuit means.

7. The apparatus of claim 6 in which said comparator means further includes means for gating said tag field defining signal to said replacement field line when said search mode defining signal is active and for gating said successful search signal to said replacement data line, thereby inserting said successful search signal into the tag field defined by said tag field defining signal of said digital data circulating in said one storage loop means.

8. The apparatus of claim 7 in which said memory apparatus includes at least one data port at an extremity of said plurality of circulating storage loop means and with said sort mode defining signal active and said key field defining signal specifying said tag field, said digital data with said successful search signal in said tag field representative of a successful search are driven to said data port for retrieval.

9. The apparatus of claim 8 in which said data port includes an input terminal and with said sort mode defining signal active, said key field defining signal spanning a non-zero data field and a data file to be loaded applied to said input terminal, said data file is loaded into said memory apparatus.

10. The apparatus of claim 9 in which said data port includes an output terminal and with said sort mode defining signal active, said key field defining signal spanning a non-zero data field and a constant applied to said input terminal, the contents of said memory apparatus are unloaded at said output terminal.

11. The apparatus of claim 7 in which said means for coupling further includes means for coupling an update field defining signal and an update data defining signal to said plurality of data processing circuit means.

12. The apparatus of claim 11 in which said comparator means includes means responsive to said mode defining signal specifying an update mode for gating said update field defining signal to said replacement field line and said update data defining signal to said replacement data line, thereby updating the data field defined by said update field defining signal of selected digital data circulating in said plurality of circulating storage loop means with the data defined by said update data defining signal in response to said update mode defining signal.

13. The apparatus of claim 5 in which said plurality of data processing circuit means are arranged sequentially in said memory apparatus, each said data processing circuit means providing a successful search chain signal, and said comparator means includes a response output, the response outputs from said plurality of data processing circuit means being commonly connected to form a response line for said memory apparatus.

14. The Apparatus of claim 13 in which each said data processing circuit means includes data retrieval control means responsive to said successful search signal from the comparator means associated therewith and to the successful search chain signal from the previous data processing circuit means in said sequential arrangement thereof for providing an enable response signal to said comparator means associated therewith and a successful search chain signal to the next following data processing circuit means, said enable response signal being rendered active only at the first data processing circuit means in the said sequential arrangement thereof having the comparator means thereof providing a successful search signal representative of a successful search, said successful search chain signal provided to the data processing circuit means following said first data processing circuit means rendering the respective enable response signals thereof inactive, each said comparator means including means for directing said digital data circulating in said one storage loop means associated therewith to said response output in response to an active enable response signal, thereby retrieving said digital data circulating in said one storage loop means associated with said first data processing circuit means.

15. The apparatus of claim 14 in which said means for coupling further includes means for coupling a next response signal to said plurality of data processing circuit means.

16. The apparatus of claim 15 in which said data retrieval control means includes means responsive to said next response signal for providing a reset signal that is rendered active only at the first data processing circuit means in said sequential arrangement thereof having the comparator means thereof providing a successful search signal representative of a successful search, and said comparator means includes means for resetting said successful search signal to the state representative of an unsuccessful search in response to an active reset signal, thereby retrieving said digital data circulating in said one storage loop means associated with the data processing circuit means following said first data processing circuit means and having the successful search signal associated therewith representative of a successful search.

17. The apparatus of claim 14 in which said comparator means comprises a sequential state machine responsive to said mode defining signal, to said key field defining signal, to said key defining signal and to said digital data circulating in at least one of said two storage loop means associated therewith for performing said data comparisons and providing state signals in accordance therewith, and comparator output logic responsive to said mode defining signal, to said key field defining signal, to said key defining signal, to said digital data circulating in one of said two storage loops associated therewith, to said enable response signal and to said state signals for providing said loop interchange signal, said successful search signal, said replacement field signal, said replacement data signal and said response output in accordance therewith.

18. The apparatus of claim 2 in which each said data processing circuit means further includes activity control means responsive to said mode defining signal specifying a reconfigure mode and to an activity signal for rendering said data processing circuit means active or inactive in accordance with said activity signal, said activity signal being applied to said loop control means to unconditionally effect said data interchanging connection for an inactive data processing circuit means and to render said loop interchange signal effective in selecting either said data interchanging connection or said isolating connection for an active data processing circuit means, thereby performing a reconfiguration of said memory apparatus in response to said reconfigure mode defining signal.

19. The apparatus of claim 18 in which each said circulating storage loop means is serially coupled through two active data processing circuit means at respective points of said loop means separated by one-half loop length, said two active data processing circuit means belonging to odd and even phases respectively, said key field defining signals belonging to said odd and even phases respectively.

20. The apparatus of claim 19 in which said activity control means further includes phase control means responsive to said mode defining signal specifying said reconfigure mode and to said activity signal for rendering said odd or even phase key field defining signals effective in accordance with the respective phase of the associated data processing circuit means.

21. The apparatus of claim 1 in which each said data processing circuit means is serially coupled in each of two adjacent circulating storage loop means.

22. The apparatus of claim 1 in which each said circulating storage loop means is serially coupled through to said data processing circuit means at respective points of said loop means separated by one-half loop length.

23. The apparatus of claim 1 in which each said circulating storage loop means comprises re-entrant shift register means.

* * * * *